US008339155B2

(12) United States Patent
Tseng et al.

(10) Patent No.: US 8,339,155 B2
(45) Date of Patent: Dec. 25, 2012

(54) SYSTEM AND METHOD FOR DETECTING SOFT-FAILS

(75) Inventors: Nan-Hsin Tseng, Shanhua Township (TW); Chin-Chou Liu, Jhubei (TW); Wei-Pin Changchien, Taichung (TW); Kin Lam Tong, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/857,270

(22) Filed: Aug. 16, 2010

(65) Prior Publication Data

US 2011/0121856 A1 May 26, 2011

Related U.S. Application Data

(60) Provisional application No. 61/264,515, filed on Nov. 25, 2009.

(51) Int. Cl.
*H03K 19/00* (2006.01)
*H03K 19/23* (2006.01)

(52) U.S. Cl. ................................ 326/16; 326/35; 326/36

(58) Field of Classification Search ................ 326/9, 12, 326/14, 16, 104, 93–95, 52, 55; 327/208, 327/199, 261

See application file for complete search history.

(56) References Cited

U.S. PATENT DOCUMENTS 5,701,090 A * 12/1997 Hidaka et al. .................... 326/32
5,808,478 A * 9/1998 Andresen ......................... 326/31
7,482,831 B2 * 1/2009 Chakraborty et al. ........... 326/12
7,508,882 B2 * 3/2009 Adamiecki et al. ............ 375/291
7,999,584 B2 * 8/2011 Rhee et al. ..................... 327/156
2009/0049331 A1 * 2/2009 Blome et al. ..................... 714/3
2009/0091333 A1 4/2009 Chung et al.
2009/0294983 A1 12/2009 Cobbley et al.
2010/0033453 A1 * 2/2010 Park et al. ..................... 345/204
2010/0244918 A1 * 9/2010 Moyer et al. .................. 327/208
2011/0006391 A1 1/2011 Lee et al.

OTHER PUBLICATIONS

Katti, G., et al., "Electrical Modeling and Characterization of Through Silicon via for Three-Dimensional ICs," IEEE Transactions on Electrical Devices, vol. 57, No. 1, Jan. 2010, pp. 256-262.

* cited by examiner

*Primary Examiner* — Shawki Ismail
*Assistant Examiner* — Crystal L Hammond
(74) *Attorney, Agent, or Firm* — Slater & Matsil, L.L.P.

(57) ABSTRACT

A system and method for detecting soft-failures in integrated circuits is provided. A circuit includes a combinatorial logic block having a first signal input and a second signal input, and a latch coupled to an output of the combinatorial logic block. The combinatorial logic block produces a pulse when only one of either a first signal provided by the first signal input or a second signal provided by the second signal input is a logical high value, and the latch captures the pulse if the pulse has a pulse width greater than a second threshold. The pulse has a pulse width that is based on a timing difference between a first signal transition on the first signal and a second signal transition on the second signal, the combinatorial logic block produces the pulse if the timing difference is greater than a first threshold, and the combinatorial logic block operates with balanced inputs.

20 Claims, 7 Drawing Sheets

SYSTEM AND METHOD FOR DETECTING SOFT-FAILS

This application claims the benefit of U.S. Provisional Patent Application Ser. No. 61/264,515, filed on Nov. 25, 2009, and entitled "System and Method for Detecting Soft-Fails," which application is incorporated herein by reference.

TECHNICAL FIELD

The present invention relates generally to integrated circuits, and more particularly to a system and method for detecting soft-failures in integrated circuits.

BACKGROUND

Generally, in integrated circuits, a soft-fail (or soft-failure) may be described as a minor defect in an electrical connection. The defect in the electrical connection may lead to an increase in electrical resistance through the electrical connection. Typically, the defect may result in an increase in the electrical resistance on the order of a few times to several thousand times the electrical resistance of a defect-free electrical connection.

The increase in the electrical resistance of the electrical connection may introduce additional delay to a signal propagation path containing the electrical connection. FIG. 1*a* illustrates two electrical signal paths, a first path 105 labeled "NORMAL" and a second path 110 labeled "HI-R." Both electrical signal paths are connected to a signal input labeled "IN." Both first path 105 and second path 110 comprise two signal vias, with one of the two vias in second path 110 being faulty (shown with cross hatching and crossed out). The faulty via in second path 110 may have a higher electrical resistance than the other vias shown.

FIG. 1*b* illustrates three signal traces, a first trace 155 representing an input signal, a second trace 160 representing an electrical signal measured at an output of first path 105, and a third trace 165 representing an electrical signal measured at an output of second path 110. Both second trace 160 and third trace 165 arise from the input signal (first trace 155) that transition from a low electric potential to a high electric potential.

Due to an inherent electrical resistance of signal vias, an electrical signal propagating through first path 105 will experience a small propagation delay. However, the propagation delay is negligible. A rise time of the input signal propagating through first path 105 (shown as interval 175) may be substantially equal to a rise time of the input signal (shown as interval 170).

However, due to a significant increase in electrical resistance of second path 110 due to the faulty via, a rise time of the input signal propagating through second path 110 (shown as interval 180) may be substantially greater than a rise time of the input signal (shown as interval 170). Duration of interval 180 may be a function of the increase in electrical resistance due to the faulty via, with a greater increase in electrical resistance resulting in a greater duration of interval 180.

The increase in propagation delay due to a soft-fail may be difficult to detect using standard circuit testing techniques. Additionally, the soft-fails that are detectable tend to be soft-fails that increase the electrical resistance by a substantial margin, i.e., soft-fail that marginally increase the electrical resistance by only a few hundred times may not be detectable.

FIG. 2 illustrates a data plot of a distribution of propagation delay increases due to soft-fails. As shown in FIG. 2, propagation delay increases of less than 1 ns may be considered to be within standard manufacturing tolerances and may be acceptable, while propagation delay increases of more than 3 ns may be detectable by standard circuit testing techniques. However, a relatively small number of soft-fails result in a propagation delay increase of 3 ns or more.

Soft-fails that cause a propagation delay increase of between 1 ns and 3 ns may make up a significant number of soft fails. However, standard circuit testing techniques may not be able to detect propagation delay increases between 1 ns and 3 ns. Therefore, there is a need for circuit testing techniques capable of detecting small propagation delay increases.

SUMMARY OF THE INVENTION

These and other problems are generally solved or circumvented, and technical advantages are generally achieved, by embodiments of a system and method for detecting soft-failures in integrated circuits.

In accordance with an embodiment, a circuit is provided. The circuit includes a combinatorial logic block having a first signal input and a second signal input, and a latch coupled to an output of the combinatorial logic block. The combinatorial logic block produces a pulse when only one of either a first signal provided by the first signal input or a second signal provided by the second signal input is a logical high value, and the latch captures the pulse if the pulse has a pulse width greater than a second threshold. The pulse has a pulse width that is based on a timing difference between a first signal transition on the first signal and a second signal transition on the second signal, the combinatorial logic block produces the pulse if the timing difference is greater than a first threshold, and the combinatorial logic block operates with balanced inputs.

In accordance with another embodiment, an integrated circuit testing system is provided. The integrated circuit testing system includes an integrated circuit to be tested for a presence of a soft-fail, a test controller that controls testing of the integrated circuit to detect a presence of a soft-fail, and a test module coupled between the integrated circuit and the test controller. The test module inputs test signals to the integrated circuit and outputs signals corresponding to the test signals from the integrated circuit. The test module includes a combinatorial logic block with a first signal input coupled to the integrated circuit and a second signal input and a latch coupled to an output of the combinatorial logic block. The combinatorial logic block produces a pulse only when a first signal provided by the first signal input and a second signal provided by the second signal input differ in value, and the latch captures the logical high pulse if the logical high pulse has a pulse width greater than a second threshold. The pulse has a pulse width that is based on a timing difference between a first signal transition on the first signal and a second signal transition on the second signal, the combinatorial logic block produces the pulse if the timing difference is greater than a first threshold, and the combinatorial logic block operates with balanced inputs.

In accordance with another embodiment, a method for testing integrated circuits is provided. The method includes providing a test signal to a test circuit and a reference circuit, generating a pulse having a pulse width based on a timing difference between a first output of the test circuit responsive to the test signal and a second output of the reference circuit responsive to the test signal, and determining a presence of a fault in the test circuit based on a duration of the pulse width An advantage of an embodiment is that soft-fails that increase propagation delays by very small amounts, i.e., minor electrical connection defects, are detectable by a simple, purely digital circuit. Digital operation also allows for easy translation to digital data, enabling rapid detection of soft-fails.

A further advantage of an embodiment is that the simple test circuit is flexible and allows for the easy implementation of different layouts for different devices under test.

Yet another advantage of an embodiment is that it is a diagnosable detector that allows for the determination of a defect location that may be used.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely an integrated circuit containing a variety of circuits formed on a substrate. The embodiments may also be applied, however, to multi-chip modules, three-dimensional stacked multi-chip modules, system on a chip, and so on.

Many techniques have been proposed to detect soft-fails, including transition detection on critical paths, at speed scan tests, and so forth, detect changes in the timing of signal transitions. However, with these techniques, propagation delay increases of about 3 ps or less are typically undetectable, even though a 3 ps increase in propagation delay may be the result of an electrical resistance increase of approximately 500 times. Furthermore, with circuits operating at one GHz and above, 3 ps may be un-sensible proportional to the circuits' path delay time.

Additionally, the performance of at speed scan tests may be dependent on the clock frequency of the circuitry being tested. For example, for circuits operating at 800 MHz, at speed scan tests may be able to detect 100 percent of soft-fails that result in an electrical resistance increase of 21 thousand times the electrical resistance of a typical via, while for circuits operating at 200 MHz, at speed testing may be able to detect 100 percent of soft-fails that result in an electrical resistance increase of 84 thousand times the electrical resistance of a typical via.

An alternate technique that may be used to detect soft-fails involves direct measurement using wafer acceptance testing (WAT) test equipment. However, WAT test equipment is typically high cost and low throughput since high resolution and high accuracy testers are needed. Furthermore, it may be difficult to collect large measurement results.

Figure 1A:
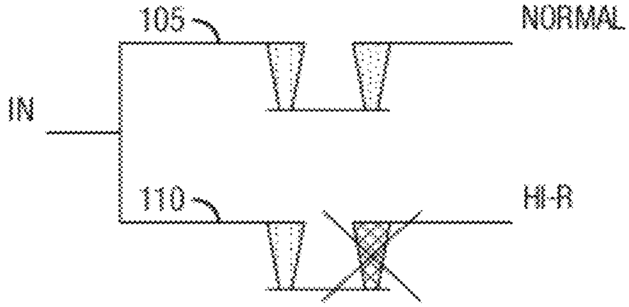
FIG. 1*a* is a diagram of two electrical signal paths.
Figure 1B:
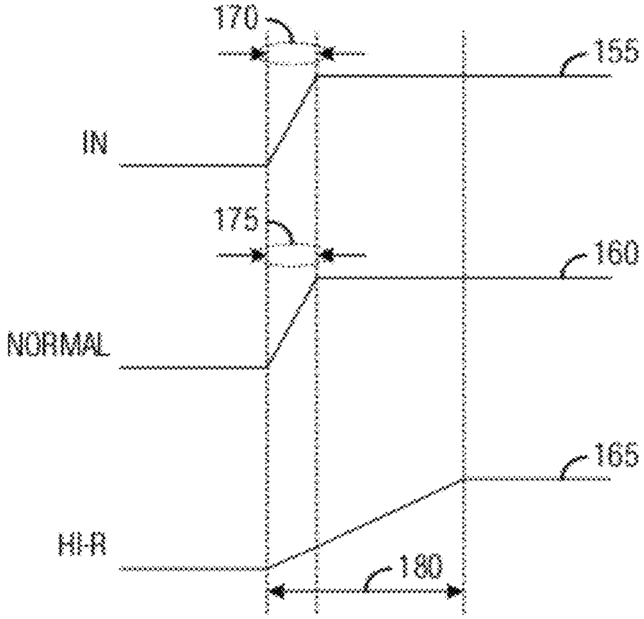
FIG. 1*b* is a diagram of three signal traces.
Figure 2:
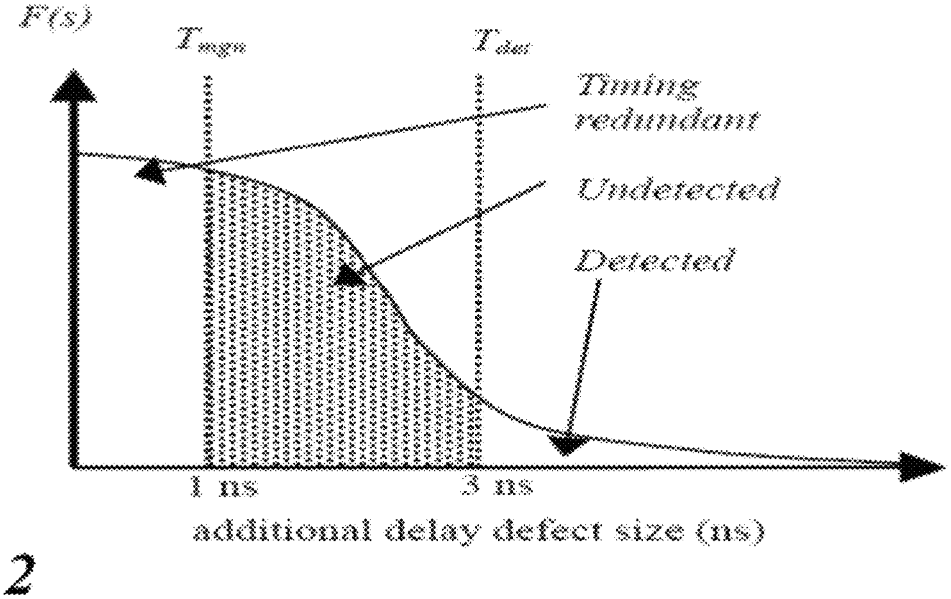
FIG. 2 is a data plot of a distribution of propagation delay increases due to soft-fails.
Figure 3:
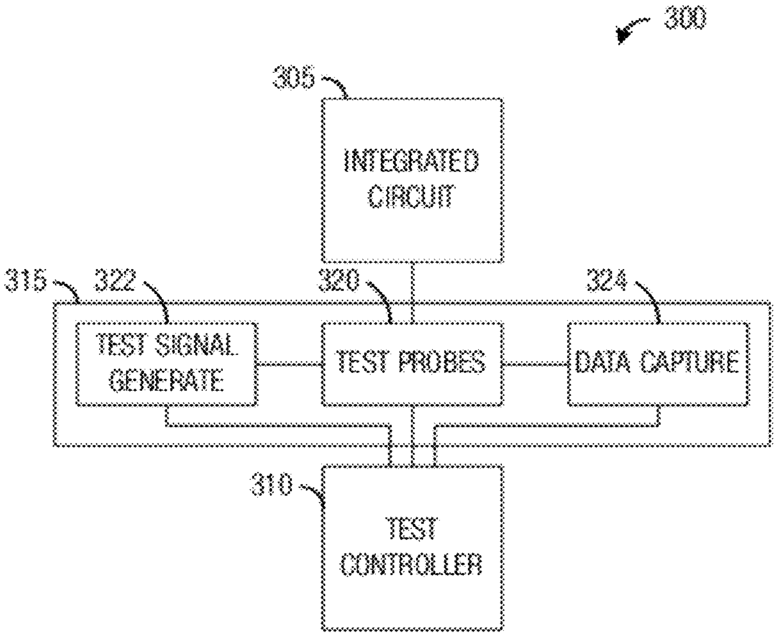
FIG. 3 is a diagram of an integrated circuit testing system.

FIG. 3 illustrates an integrated circuit testing system 300. Integrated circuit testing system 300 may be used to test for the presence of soft-fails in an integrated circuit 305. Integrated circuit 305 being tested may be in the form of a wafer containing a plurality of integrated circuits, a die, a packaged die, a multi-chip module, a three-dimensional stacked multi-chip module, a system on a chip, or so forth. In general, integrated circuit 305 may be in any particular state or form and may be tested in integrated circuit testing system 300 given the use of a proper adapter or module.

The testing of integrated circuit 305 may be controlled by a test controller 310, which may be a computer system with testing software and hardware to facilitate the testing of integrated circuit 305. For example, test controller 310 may include software to generate test signals and vectors, as well as analysis software that may be used to analyze test results to determine if integrated circuit 305 is faulty. If integrated circuit 305 is faulty, then the analysis software may be able to determine what part of integrated circuit 305 is faulty, fault type, fault location, and so on. Test controller 310 may also have a memory that may be used to store the test vectors, testing software, and test results.

A test module 315 may serve as an interface between integrated circuit 305 and test controller 310. Test module 315 may include a fixture for holding integrated circuit 305 in position while it undergoes testing. Test module 315 may also include test probes 320 to allow electrical signals to be inputted to integrated circuit 305 and outputted from integrated circuit 305. Test probes 320 may also be used to provide electrical power to integrated circuit 305.

Test module 315 may also include a test signal generate unit 322. Test signal generate unit 322 may be used to generate test signals to be used to test integrated circuit 305. For example, test signal generate unit 322 may receive specifications of test signals and/or test vectors from test controller 310 and test signal generate unit 322 may generate the actual test signals from the specifications of the test signals and/or test vectors.

Test module 315 may also include a data capture unit 324. Data capture unit 324 may be used to capture outputs from integrated circuit 305 in response to the test signals and/or test vectors provided to integrated circuit 305. Data capture unit 324 may store the outputs from integrated circuit 305 in its own on-board memory or data capture unit 324 may buffer the outputs from integrated circuit 305 while the outputs are provided to test controller 310 for processing and/or storage.

In an alternate embodiment, test signal generate unit 322 and/or data capture unit 324 may be part of test controller 310 rather than test module 315. In such an embodiment, test module 315 may be used mainly as an interface between test controller 310 and integrated circuit 305.

Figure 4:
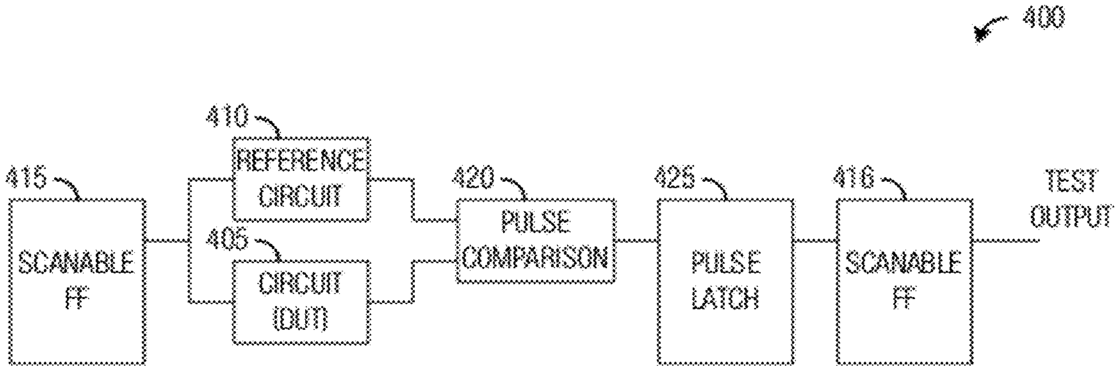
FIG. 4 is a diagram of a test circuit configuration for testing a circuit of an integrated circuit in an integrated circuit testing system.

FIG. 4 illustrates a test circuit configuration 400 for testing a circuit of an integrated circuit in an integrated circuit testing system. Test circuit configuration 400 may be used to test a test circuit 405 for the presence of soft-fails. Test circuit 405 may commonly be referred to as device-under-test (DUT). Test circuit 405 may be part of an integrated circuit, such as integrated circuit 305.

In order to test for the presence of soft-fails, test circuit 405 may be compared against a reference circuit 410. Reference circuit 410 may be identical or substantially identical to test circuit 405. Alternatively, reference circuit 410 may be designed to have a propagation delay that is equal to (or substantially equal to) an expected propagation delay of test circuit 405.

Both test circuit 405 and reference circuit 410 may be part of the integrated circuit. For example, test circuit 405 and reference circuit 410 may be created adjacent to one another on the integrated circuit. Alternatively, test circuit 405 may be part of the integrated circuit being tested, while reference circuit 410 may be part of a different integrated circuit being used to test the integrated circuit being tested.

Test circuit configuration 400 also includes scanable flip flops 415 and 416. Scanable flip flops 415 and 416 may be placed at an input and an output of test circuit 405 and reference circuit 410. The scanable flip flops used allow for the scanning in of test signals and the scanning out of output signals. The scanable flip flops may be part of the integrated circuit that includes test circuit 405. Alternatively, the scanable flip flops may be part of a test module, such as test module 315.

Between an output of test circuit 405 and reference circuit 410 and scanable flip flop 416 may be a pulse comparison unit 420. Pulse comparison unit 420 may have as inputs the outputs of test circuit 405 and reference circuit 410. From the inputs, pulse comparison unit 420 may produce an output signal based on a relative timing between the two inputs. For example, if the outputs of test circuit 405 and reference circuit 410 both have a rising edge due to an input signal provided to their respective inputs, pulse comparison unit 420 may produce a pulse with a pulse width that is a function of any timing differences in the rising edges in the outputs of test circuit 405 and reference circuit 410.

Preferably, pulse comparison unit 420 may be created from combinatorial logic with sufficient response time to measure small timing differences between the outputs of test circuit 405 and reference circuit 410, on the order of pico seconds, for example. Additionally, pulse comparison unit 420 may have balanced inputs so that a timing difference presence in its inputs may produce the same output signal, independent of which input is leading or lagging.

Pulse comparison unit 420 may be part of the integrated circuit containing test circuit 405. Alternatively, pulse comparison unit 420 may be part of test module 315 used to interface the integrated circuit containing test circuit 405 to a test controller, such as test controller 310.

Between an output of pulse comparison unit 420 and scanable flip flop 416 may be a pulse latch 425. Pulse latch 425 may be designed to capture a pulse on an output of pulse comparison unit 420 and hold the value until scanable flip flop 416 may store the value. Pulse latch 425 may be designed to capture the pulse on the output of pulse comparison unit 420 only if the pulse exceeds a desired duration. For example, if the pulse on the output of pulse comparison unit 420 is shorter than the desired duration, then pulse latch 425 may not capture the pulse since short pulse duration may be indicative of propagation delay changes that are within manufacturing tolerances. Scanable flip flop 416 may capture an output of pulse latch 425 to allow for the output signal to be scanned out for processing by the integrated circuit testing system.

Figure 5A:
FIG. 5*a* is a diagram of a first circuit.

FIG. 5a illustrates a first circuit 500. First circuit 500 may be a logical implementation of pulse comparison unit 420. As shown in FIG. 5a, first circuit 500 may be a logical exclusive-or (X-OR) gate. An X-OR gate may produce at its output a logical high value if signals at its two inputs are different, while, if signals at its two inputs are equal, then the X-OR gate may produce a logical low value at its output. Inputs to first circuit 500 (labeled A and B in FIG. 5a) may be outputs of test circuit 405 and reference circuit 410. Output of first circuit 500 may be provided to pulse latch 425.

Figure 6A:
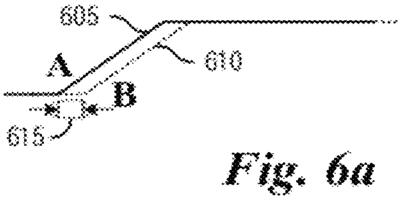
FIG. 6*a* is a diagram of two traces (first and second traces) representing inputs to a pulse comparison unit.

FIG. 6a illustrates two traces representing inputs to a pulse comparison unit. A first trace 605 represents a first input (input A, for example) to a pulse comparison unit, such as pulse comparison unit 420 and a second trace 610 represents a second input (input B, for example) to pulse comparison unit 420. As shown in FIG. 6a, second input lags first input by an amount shown as interval 615.

Figure 6B:
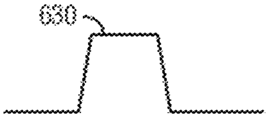
FIG. 6*b* is a diagram of a third trace representing an output of the first circuit.

FIG. 6b illustrates a third trace 630 representing an output of first circuit 500. Third trace 630 starts with a logical low value while first trace 605 and second trace 610 are both equal (at a logical low value), then as first trace 605 transitions to a logical high value and second trace 610 remains at the logical low value, third trace 630 transitions to the logical high value. Finally, as second trace 610 transitions to the logical high value and both first trace 605 and second trace 610 attain the same logical high value, third trace 630 transitions back to the logical low value.

Figure 7A:
FIG. 7*a* is a diagram of two traces (fourth and fifth) representing inputs to a pulse comparison unit.

FIG. 7a illustrates two traces representing inputs to a pulse comparison unit. A fourth trace 705 represents a first input (input A, for example) to a pulse comparison unit, such as pulse comparison unit 420 and a fifth trace 710 represents a second input (input B, for example) to pulse comparison unit 420. As shown in FIG. 7a, second input leads first input by an amount shown as interval 715.

Figure 7B:
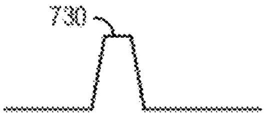
FIG. 7*b* is a diagram of a sixth trace representing an output of the first circuit.

FIG. 7b illustrates a sixth trace 730 representing an output of first circuit 500. Sixth trace 730 starts with a logical low value while fifth trace 710 and fourth trace 705 are both equal (at a logical low value), then as fifth trace 710 transitions to a logical high value and fourth trace 705 remains at the logical low value, sixth trace 730 transitions to the logical high value. Finally, as fourth trace 705 transitions to the logical high value and both fifth trace 710 and fourth trace 705 attain the same logical high value, sixth trace 730 transitions back to the logical low value.

However, due to an unbalanced design of first circuit 500 (a logical X-OR gate), pulse widths of third trace 630 and sixth trace 730 may not be symmetrical. Depending on a design of first circuit 500, a pulse width of its output may differ depending on which of its two inputs (either input A or input B) leads or lags. As shown in FIGS. 6*b* and 7*b*, for a given design of first circuit 500, pulse width of third trace 630 may be substantially wider than pulse width of sixth trace 730, even if a lead or lag interval (shown in FIGS. 6*a* and 7*a* as intervals 615 and 715, respectively) between its two inputs are substantially equal.

Figure 5B:
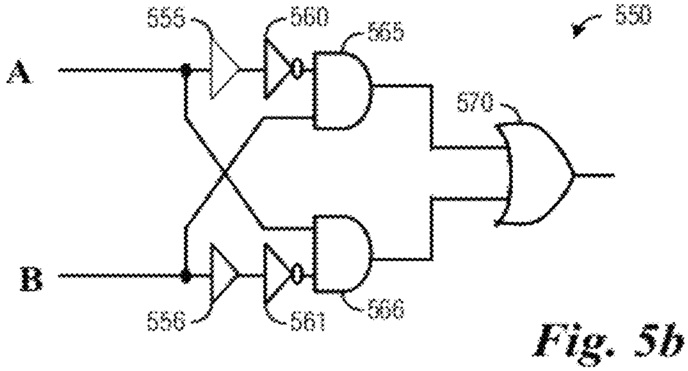
FIG. 5*b* is a diagram of a second circuit.

FIG. 5*b* illustrates a second circuit 550. Second circuit 550 may be a logical implementation of pulse comparison unit 420 with balanced inputs. Second circuit 550 may produce at its output a logical high value if signals at its two inputs are different, while, if signals at its two inputs are equal, then second circuit 550 may produce a logical low value at its output. Inputs to second circuit 550 (labeled A and B in FIG. 5*b*) may be outputs of circuit 405 and reference circuit 410. Output of second circuit 550 may be provided to pulse latch 425.

Second circuit 550 may be a balanced input implementation of a logical X-OR gate. Being a balanced input logical X-OR gate, second circuit 550 may produce an output pulse of substantially equal pulse width, independent of which one of these two inputs leads or lags.

The two inputs to second circuit 550 may be symmetrical to help ensure balanced input operation. Input A of second circuit 550 includes a first buffer 555 and a first inverting buffer 560, as well as a first logical AND gate 565. First buffer 555 and first inverting buffer 560 may be used to impart a small delay to a signal at input A. Similarly, input B of second circuit 550 includes a second buffer 556 and a second inverting buffer 561, as well as a second logical AND gate 566. The number of buffers and inverting buffers may depend on the amount of delay to be imparted to the signals at input A and input B.

First logical AND gate 565 and second logical AND gate 566 may be cross-coupled, with a signal at input B being provided to a second input of first logical AND gate 565 and a signal at input A being provided to a second input of second logical AND gate 566. The cross-coupled inputs to first logical AND gate 565 and second logical AND gate 566 help to ensure balanced input operation.

Outputs of first logical AND gate 565 and second logical AND gate 566 may be provided to a logical OR gate 570, which may combine the two signals at its inputs to provide an output of pulse comparison unit 420.

Figure 6C:
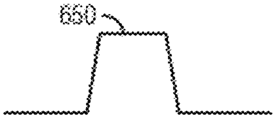
FIG. 6*c* is a diagram of a seventh trace representing an output of the second circuit

FIG. 6*c* illustrates a seventh trace 650 representing an output of second circuit 550. Seventh trace 650 starts with a logical low value while first trace 605 and second trace 610 are both equal (at a logical low value), then as first trace 605 transitions to a logical high value and second trace 610 remains at the logical low value, seventh trace 650 transitions to the logical high value. Finally, as second trace 610 transitions to the logical high value and both first trace 605 and second trace 610 attain the same logical high value, seventh trace 650 transitions back to the logical low value.

Figure 7C:
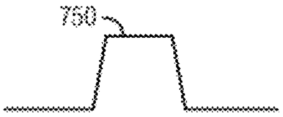
FIG. 7*c* is a diagram of an eighth trace representing an output of the second circuit.

FIG. 7*c* illustrates an eighth trace 750 representing an output of second circuit 550. Eighth trace 750 starts with a logical low value while fifth trace 710 and fourth trace 705 are both equal (at a logical low value), then as fifth trace 710 transitions to a logical high value and fourth trace 705 remains at the logical low value, eighth trace 750 transitions to the logical high value. Finally, as fourth trace 705 transitions to the logical high value and both fifth trace 710 fourth trace 705 attain the same logical high value, eighth trace 750 transitions back to the logical low value.

Due to the balanced input of second circuit 550, pulse width of seventh trace 650 shown in FIG. 6*c* and pulse width of eighth trace 750 shown in FIG. 7*c* are substantially equal, which may allow for proper operation of integrated circuit testing system regardless of which input signal is lagging or leading.

Figure 8A:
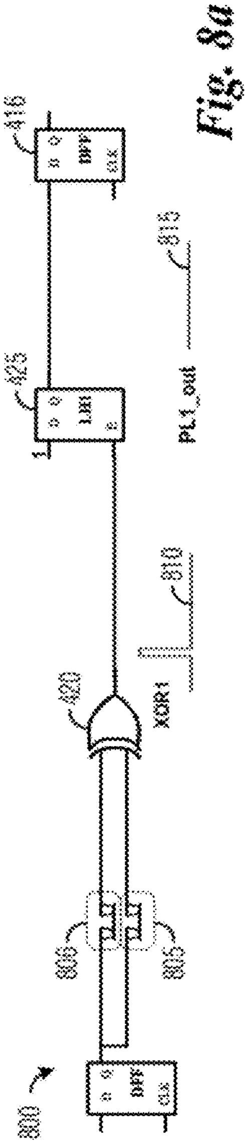
FIG. 8*a* is a diagram of a first test configuration.

FIG. 8*a* illustrates a first test configuration 800. First test configuration 800 tests a first test circuit 805 with a first reference circuit 806. As shown in FIG. 8*a*, first test circuit 805 and first reference circuit 806 are substantially identical circuits. A first trace 810 illustrates an output of pulse comparison unit 420 from outputs of first test circuit 805 and first reference circuit 806. Since first test circuit 805 and first reference circuit 806, output of pulse comparison unit 420 (first trace 810) may be a pulse of short duration, with a duration sufficiently short to not be latched by pulse latch 425. An output of pulse latch 425 (first output trace 815) may be captured by scanable flip flop 416.

Figure 8B:
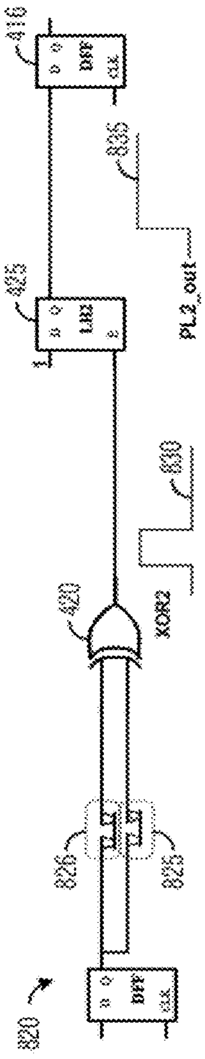
FIG. 8*b* is a diagram of a second test configuration.

FIG. 8*b* illustrates a second test configuration 820. Second test configuration 820 tests a second test circuit 825 with a second reference circuit 826. As shown in FIG. 8*b*, second test circuit 825 contains a soft-fail (shown at cross-hatched via). Second reference circuit 826 is substantially identical to second test circuit 825 but without a soft-fail. A second trace 830 illustrates an output of pulse comparison unit 420 from outputs of second test circuit 825 and second reference circuit 826. Since second test circuit 825 has a soft-fail while second reference circuit 826 does not, output of pulse comparison unit 420 (second trace 830) may be a pulse of substantial duration, with a sufficiently long duration so that it will be latched by pulse latch 425. An output of pulse latch 425 (second output trace 835) may be captured by scanable flip flop 416. A high output of pulse latch 425 (and scanable flip flop 416) indicates that there was at least one soft-fail in second test circuit 825.

Figure 8C:
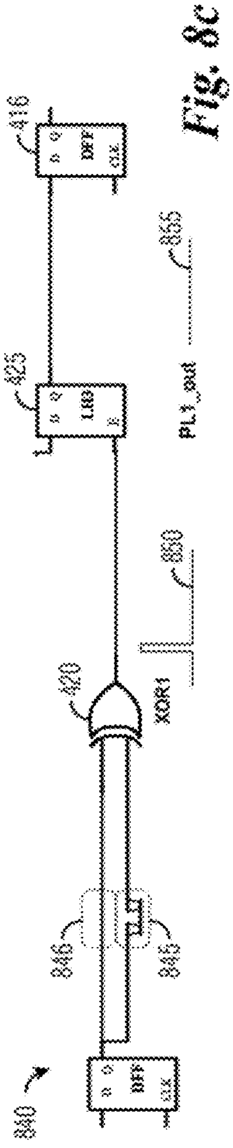
FIG. 8*c* is a diagram of a third test configuration.

FIG. 8*c* illustrates a third test configuration 840. Third test configuration 840 tests a third test circuit 845 with a third reference circuit 846. As shown in FIG. 8*c*, third test circuit 845 is substantially identical to first test circuit 805. Third reference circuit 846 does not contain circuitry and is only an electrical conductor. A third trace 850 illustrates an output of pulse comparison unit 420 from outputs of third test circuit 845 and third reference circuit 846. While third test circuit 845 has circuitry while third reference circuit 846 does not and therefore may impart a measurable propagation delay on a signal at its input while third reference circuit 846 does not, output of pulse comparison unit 420 (third trace 850) remains a pulse of short duration, with a duration sufficiently short to not be latched by pulse latch 425. An output of pulse latch 425 (third output trace 855) may be captured by scanable flip flop 416. The balanced input operation of pulse comparison unit 420 ensures that inputs with a very large propagation delay difference may not indicate the presence of soft-fails in third test circuit 845.

Figure 9A:
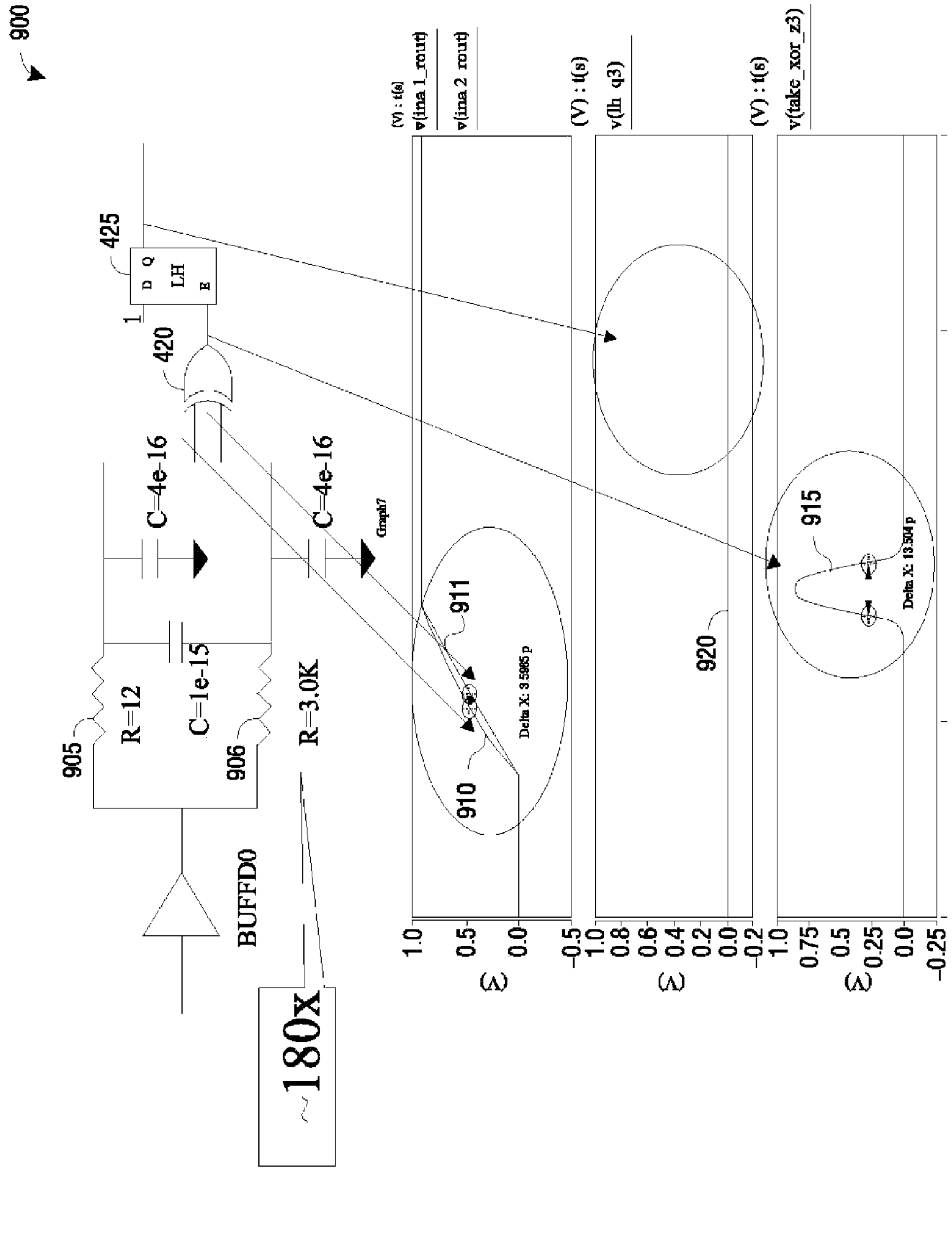
FIG. 9*a* is a diagram of a fourth test configuration.

FIG. 9*a* illustrates a fourth test configuration 900. Fourth test configuration 900 includes a reference circuit with a resistor 905 having an electrical resistance of 12 ohms (an expected resistance of a signal via) and a test circuit with a resistor 906 having an electrical resistance of 3 k ohms (representing a soft-fail that resulted in an approximate electrical resistance difference of 180 times greater than a typical via). A first trace 910 and a second trace 911 illustrate signals at outputs of the reference circuit and the test circuit, respectively. With the only difference between the reference circuit and the test circuit being the electrical resistance of resistors 905 and 906, respectively second trace 911 lags first trace 910 by approximately 3.59 ps.

A third trace 915 illustrates a signal at an output of pulse comparison unit 420. Third trace 915 illustrates that with pulses shown in first trace 910 and second trace 911, pulse comparison unit 420 produces a pulse with pulse width 13.50 ps. A fourth trace 920 illustrates a signal at an output of pulse latch 425. Since the pulse width of the pulse shown in third trace 915 was insufficiently long in duration, pulse latch was not able to capture the change in third trace 915. Therefore, fourth trace 920 remains at a logical low value and a soft-fail that resulted in a change in electrical resistance of about 180 times was not detected.

Figure 9B:
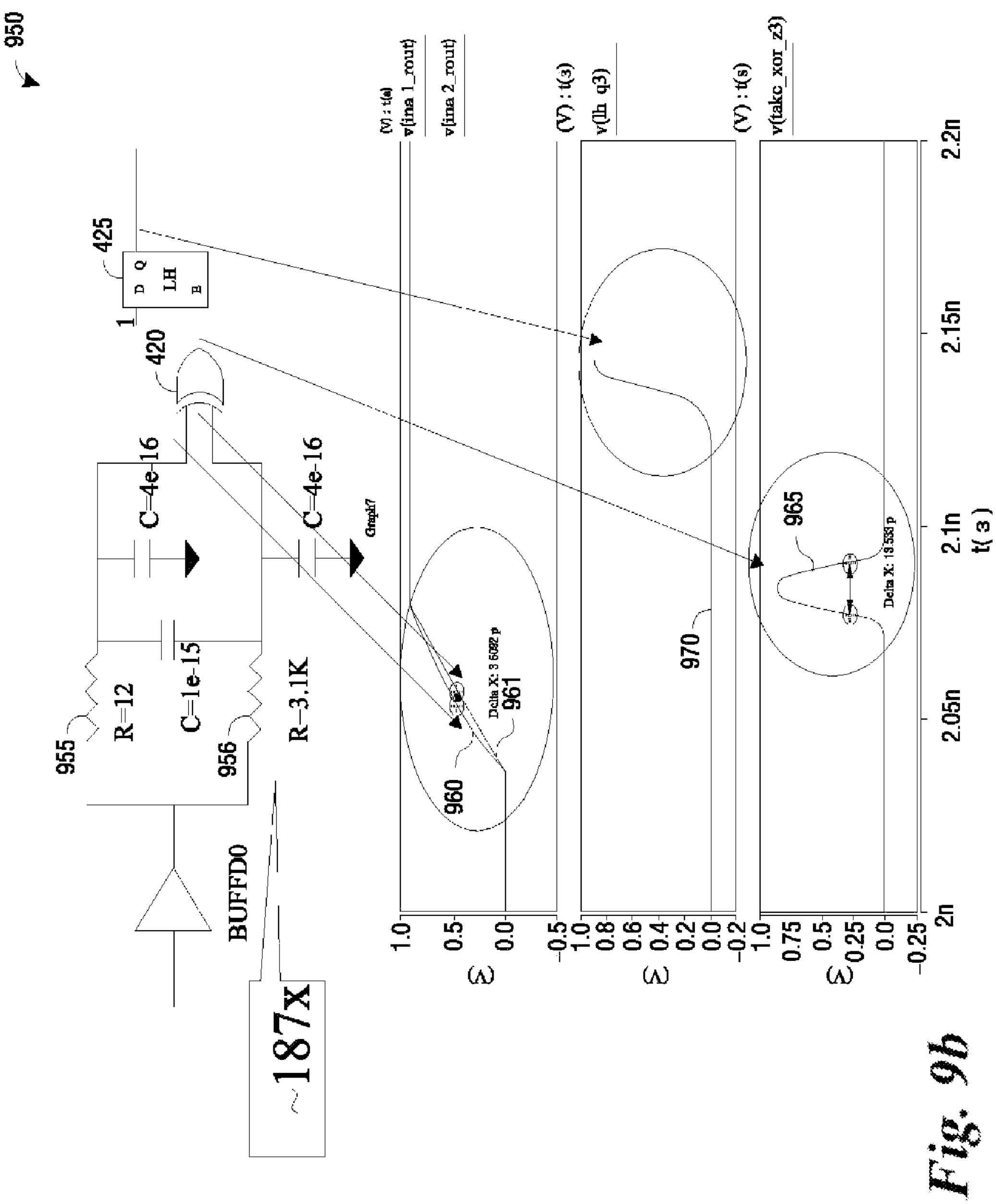
FIG. 9*b* is a diagram of a fifth test configuration.

FIG. 9*b* illustrates a fifth test configuration 950. Fifth test configuration 950 includes a reference circuit with a resistor 955 having an electrical resistance of 12 ohms (an expected resistance of a signal via) and a test circuit with a resistor 956 having an electrical resistance of 3.1 k ohms (representing a soft-fail that resulted in an approximate electrical resistance difference of 187 times). A fifth trace 960 and a sixth trace 961 illustrate signals at outputs of the reference circuit and the test circuit, respectively. With the only difference between the reference circuit and the test circuit being the electrical resistance of resistors 955 and 956, respectively sixth trace 961 lags fifth trace 960 by approximately 3.60 ps.

A seventh trace 965 illustrates a signal at an output of pulse comparison unit 420. Seventh trace 965 illustrates that with pulses shown in fifth trace 960 and sixth trace 961, pulse comparison unit 420 produces a pulse with pulse width 13.53 ps. An eighth trace 970 illustrates a signal at an output of pulse latch 425. Since the pulse width of the pulse shown in third trace 915 was sufficiently long in duration, pulse latch was able to capture the change in seventh trace 965 and transition to a logical high level. Therefore, a soft-fail that resulted in a change in electrical resistance of approximately 187 times was detected.

The soft-fail detection capability of pulse comparison unit 420 implemented as second circuit 550 may vary depending on a drive capacity of logic gates making up second circuit 550. Discounting logical OR gate 570, second circuit 550 comprises logical AND gates, inverters, and buffers. Analysis of second circuit 550 with logical AND gates, inverters, and buffers of different drive capacity was performed to determine a minimum electrical resistance change detectable by pulse comparison unit 420 implemented as second circuit 550 for different process corners.

The analysis makes use of a reference circuit and a test circuit with 200 serially connected vias with a typical via electrical resistance of eight ohms. The logical AND gates, inverters, and buffers with a variety of drive capacity ranging from D0 (smallest) to D4 (largest) was evaluated. A total of six second circuit 550 types were evaluated (types A through F). For example, second circuit 550 type A has logical AND gates, inverters, and buffers all with D2 drive capacity, while second circuit 550 type B has logical AND gates and inverters with D2 drive capacity and buffers with D1 drive capacity.

The process corners evaluated include: FF—FAST PMOS transistor and FAST NMOS transistor; FS—FAST PMOS transistor and SLOW NMOS transistor; TT—TYPICAL PMOS transistor and TYPICAL NMOS transistor; SF—SLOW PMOS transistor and FAST NMOS transistor; and SS—SLOW PMOS transistor and SLOW NMOS transistor.

Tables 1 and 2 provide a summary of results, with Table 1 summarizing results for a buffer with a first drive capability and Table 2 summarizing results for the buffer with a second drive capability. Entries in Tables 1 and 2 under column "Process Corners (K ohms)" indicate for a given drive capacity of components of second circuit 550 (which may range from D0 (small) to D4 (large)) and for a given process corner (FF, FS, TT, SF, or SS), second circuit 550 may be able to detect a soft-fail that changes the electrical resistance of a via to a listed electrical resistance. For example, for a second circuit 550 of type A (logical AND gates, inverters, and buffers all with a drive capacity of D2) and FF process corner, a soft-fail with an incremental electrical resistance of 8.5 K ohms may be detected.

Entries in Tables 1 and 2 under column "Process Corners (Electrical Resistance Multiplier)" indicate for a given drive capacity of components of second circuit 550 (which may range from D0 (small) to D4 (large)) and for a given process corner (FF, FS, TT, SF, or SS), second circuit 550 may be able to detect a soft-fail that changes the electrical resistance of a via by a listed multiplier. For example, for a second circuit 550 of type A (logical AND gates, inverters, and buffers all with a drive capacity of D2) and FF process corner, a soft-fail with an electrical resistance that is 862.5 times of a standard via (8 ohms) may be detected. The multiplier is computed as:

$$\frac{(8.5\ \mathrm{K\Omega} - 1.6\ \mathrm{K\Omega})}{8\ \Omega} = 862.5$$

TABLE 1

Minimum Detected Electrical Resistance and Electrical Resistance Multiplier for Second Circuit Types A-C.

| | | | Process Corners (K ohms) | | | | | Process Corners (Electrical Resistance Multiplier) | | | | |
|---|---|---|---|---|---|---|---|---|---|---|---|---|
| Cells | Drive | | FF | FS | TT | SF | SS | FF | FS | TT | SF | SS |
| AND | D2 | A | 8.5 | 7.7 | 9.6 | 11.9 | 11 | 862.5 | 762.5 | 1000 | 1287.5 | 1175 |
| INV | D2 | | | | | | | | | | | |
| BUF | D2 | | | | | | | | | | | |
| AND | D2 | B | 6.5 | 3.1 | 6.2 | 8.2 | 5.1 | 612.5 | 187.5 | 575 | 825 | 437.7 |
| INV | D2 | | | | | | | | | | | |
| BUF | D1 | | | | | | | | | | | |
| AND | D2 | C | 7.8 | 6.8 | 8.8 | 11.2 | 10.1 | 775 | 650 | 900 | 1200 | 1062.5 |
| INV | D4 | | | | | | | | | | | |
| BUF | D2 | | | | | | | | | | | |

TABLE 2

Minimum Detected Electrical Resistance and Electrical Resistance Multiplier for Second Circuit Types D-F.

| | | | Process Corners (K ohms) | | | | | Process Corners (Electrical Resistance Multiplier) | | | | |
|---|---|---|---|---|---|---|---|---|---|---|---|---|
| Cells | Drive | | FF | FS | TT | SF | SS | FF | FS | TT | SF | SS |
| AND | D2 | D | 8.8 | 8 | 9.7 | 11.9 | 11 | 900 | 800 | 1012.5 | 1287.5 | 1175 |
| INV | D2 | | | | | | | | | | | |
| BUF | D2 | | | | | | | | | | | |
| AND | D2 | E | 6.7 | 3.4 | 6.4 | 8.3 | 4.8 | 637.5 | 225 | 600 | 837.5 | 400 |
| INV | D2 | | | | | | | | | | | |
| BUF | D1 | | | | | | | | | | | |
| AND | D2 | F | 8.1 | 7 | 8.9 | 11.2 | 10 | 812.5 | 675 | 912.5 | 1200 | 1050 |
| INV | D4 | | | | | | | | | | | |
| BUF | D2 | | | | | | | | | | | |

Figure 10:
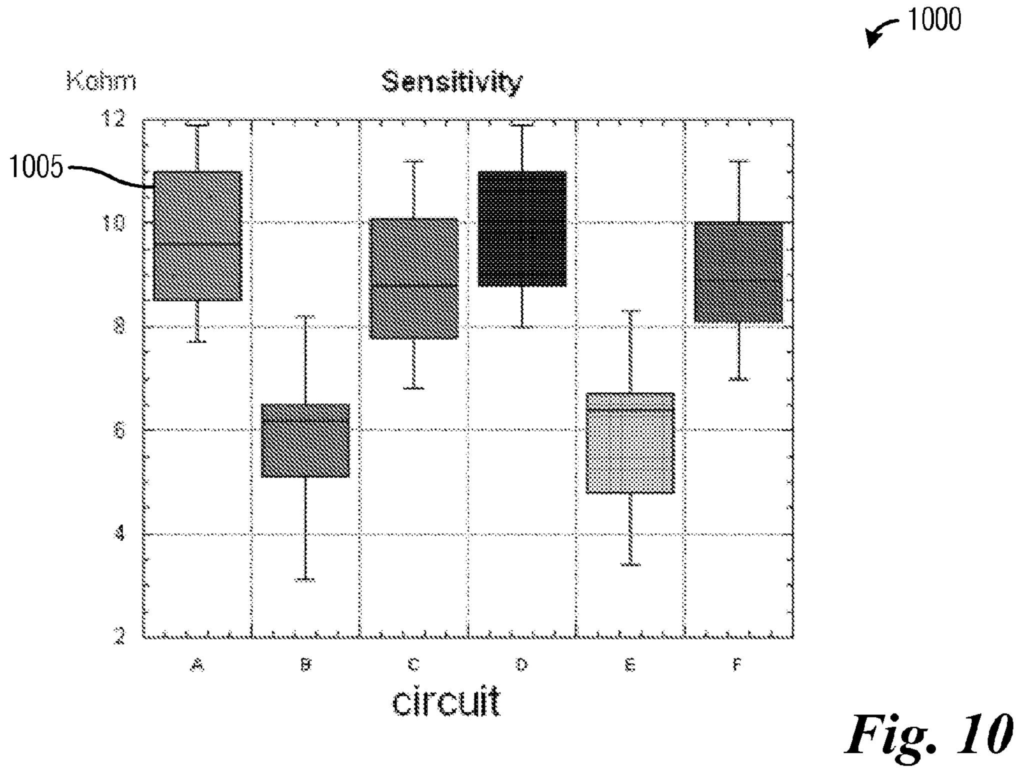
FIG. 10 is a data plot of minimum detected electrical resistance for each of six second circuit types.

FIG. 10 illustrates a data plot 1000 of minimum detected electrical resistance for each of the six second circuit types. An electrical resistance range 1005, for example, spans from 8.5 K ohms to 11 K ohms.

Figure 11A:
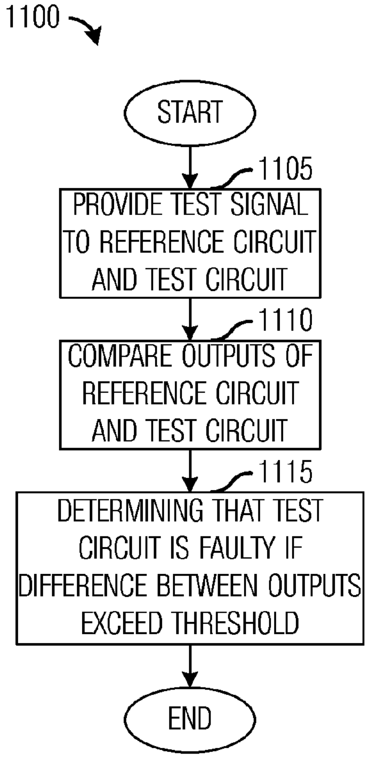
FIG. 11*a* is a flow diagram of high-level operations in determining the presence of a soft-fail in a circuit.

FIG. 11*a* illustrates a flow diagram of high-level operations 1100 in determining the presence of a soft-fail in a circuit. Operations 1100 may be indicative of high-level operations occurring in an integrated circuit testing system, such as integrated circuit testing system 300, wherein the integrated circuit testing system makes use of a pulse comparison unit, such as pulse comparison unit 420, to detect soft-fails that increase the electrical resistance by small margins. Operations 1100 may take place while the integrated circuit testing system is testing an integrated circuit for the presence of failures, such as soft-fails. Operations 1100 may continue while the integrated circuit testing system is testing integrated circuits for failures and may stop when the integrated circuit testing system is no longer testing integrated circuits.

Operations 1100 may begin with the integrated circuit testing system providing test signals to a test circuit of the integrated circuit and a reference circuit (block 1105). As discussed previously, the reference circuit and the test circuit may be a part of the integrated circuit, or they may be on separate integrated circuits. According to an embodiment, the test signals may be one or more signal transitions that may be scanned to the test circuit and the reference circuit.

As the test signals are scanned to the test circuit and the reference circuit, outputs corresponding to the test signals from the test circuit and the reference circuit may be compared (block 1110). The comparison of the outputs from the test circuit and the reference circuit may be based on relative timing of corresponding signal level transitions (from high to low or from low to high, for example). Based on the comparison of the outputs from the test circuit and the reference circuit, the test circuit may be determined to be faulty or not faulty (block 1115). For example, if there is very little or no difference in timing of corresponding signal level transitions, then the test circuit may be determined to be not faulty. If there is very large difference in timing of corresponding signal level transitions, then the faulty/not faulty nature of the test circuit may not be determined and other testing may need to be performed. If the difference in timing of corresponding signal level transitions fall within a specified interval, then the test circuit may be determined to be faulty. Operations 1100 may then terminate.

Figure 11B:
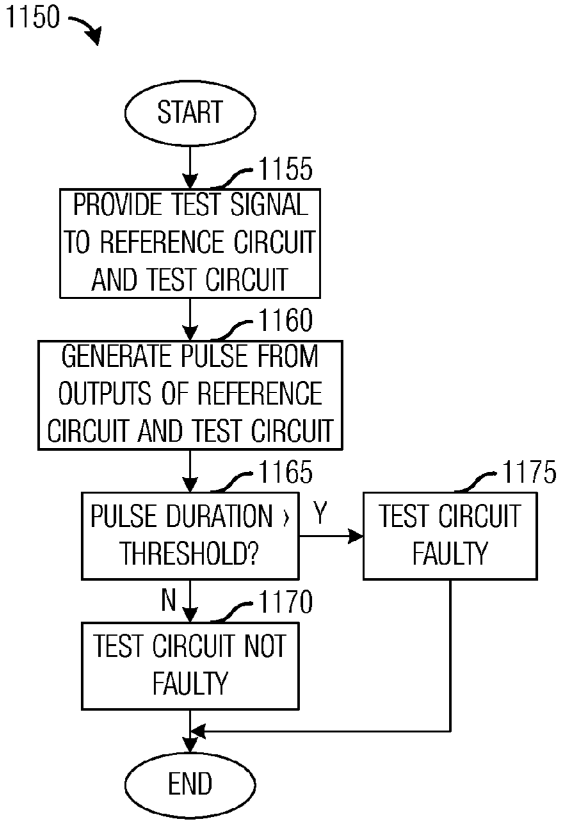
FIG. 11*b* is a flow diagram of detailed operations in determining the presence of a soft-fail in a circuit.

FIG. 11*b* illustrates a flow diagram of detailed operations 1150 in determining the presence of a soft-fail in a circuit. Operations 1150 may be indicative of high-level operations occurring in an integrated circuit testing system, such as integrated circuit testing system 300, wherein the integrated circuit testing system makes use of a pulse comparison unit, such as pulse comparison unit 420, to detect soft-fails that increase the electrical resistance by small margins. Operations 1150 may take place while the integrated circuit testing system is testing an integrated circuit for the presence of failures, such as soft-fails. Operations 1150 may continue while the integrated circuit testing system is testing integrated circuits for failures and may stop when the integrated circuit testing system is no longer testing integrated circuits.

Operations 1150 may begin with the integrated circuit testing system providing test signals to a test circuit of the integrated circuit and a reference circuit (block 1155). As discussed previously, the reference circuit and the test circuit may be a part of the integrated circuit, or they may be on separate integrated circuits. According to an embodiment, the test signals may be one or more signal transitions that may be scanned to the test circuit and the reference circuit.

Outputs corresponding to the test signals may then be used to generate a pulse (block 1160). The pulse may have a pulse width that is based on a timing difference between the outputs corresponding to the test signals from the test circuit and the reference circuit. The pulse may be produced by a pulse comparison unit, such as pulse comparison unit 420. Pulse comparison unit 420 may be implemented as a balanced input logical X-OR gate, for example.

A pulse width of the pulse generated from the timing difference between the outputs corresponding to the test signals from the test circuit and the reference circuit may then be compared with a threshold (block 1165). A comparison of the pulse with the threshold may be accomplished by attempting to latch to the value of the pulse by a pulse latch. If the pulse has a pulse width that is less than the threshold, then the pulse latch may not be able to latch onto the pulse and a value stored in the pulse latch does not change. If the pulse has a pulse width that is greater than the threshold, then the pulse latch may be able to latch onto the pulse and the value stored in the pulse latch corresponds to the value of the pulse, logical high, for example.

If the value stored in the pulse latch is logical low (i.e., the pulse latch was not able to latch onto the pulse due to its pulse width being less than the threshold), then the test circuit may be determined to be not faulty (block 1170). If the value stored in the pulse latch is logical high (i.e., the pulse latch was able to latch onto the pulse due to its pulse width being greater than or equal to the threshold), then the test circuit may be determined to be faulty (block 1175). Operations 1150 may then terminate.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:

a combinatorial logic block having a first signal input and a second signal input, the combinatorial logic block configured to produce a pulse when only one of either a first signal provided by the first signal input or a second signal provided by the second signal input is a logical high value, wherein the pulse has a pulse width that is based on a timing difference between a first signal transition on the first signal and a second signal transition on the second signal, wherein the combinatorial logic block produces the pulse if the timing difference is greater than a first threshold, and wherein the combinatorial logic block operates with balanced inputs; and a latch coupled to an output of the combinatorial logic block, the latch configured to capture the pulse if the pulse has a pulse width greater than a second threshold.

2. The circuit of claim 1, wherein the combinatorial logic block comprises a balanced input logical exclusive-or gate.

3. The circuit of claim 2, wherein the combinatorial logic block comprises:

a first buffer having a first input coupled to the first signal input;

a first inverter having a first input coupled to an output of the first buffer;

a first AND gate having a first input coupled to an output of the first inverter and a second input coupled to the second signal input;

a second buffer having a first input coupled to the second signal input;

a second inverter having a first input coupled to an output of the second buffer;

a second AND gate having a first input coupled to an output of the second inverter and a second input coupled to the first signal input; and an OR gate having a first input coupled to an output of the first AND gate and a second input coupled to an output of the second AND gate.

4. The circuit of claim 3, wherein the first buffer comprises a first plurality of buffers, wherein the second buffer comprises a second plurality of buffers, and wherein a number of buffers in the first plurality of buffers and a number of buffers in the second plurality of buffers are equal.

5. The circuit of claim 4, wherein the number of buffers in the first plurality of buffers and the number of buffers in the second plurality of buffers is based on the first threshold.

6. The circuit of claim 1, wherein the combinatorial logic block comprises complementary metal oxide semiconductor (CMOS) transistors.

7. The circuit of claim 1, further comprising:

a test circuit coupled to the first signal input of the combinatorial logic block, wherein the test circuit has an expected propagation delay; and a reference circuit coupled to the second signal input of the combinatorial logic block, the reference circuit configured to have a second propagation delay substantially equal to the expected propagation delay, wherein the circuit is used to determine a presence of a soft-fail in the test circuit, and wherein an actual propagation delay of the test circuit is greater than the expected propagation delay if the test circuit has a soft-fail.

8. The circuit of claim 7, further comprising:

a first scanable flip flop coupled to an input of the test circuit and an input of the reference circuit, the first scanable flip flop configured to scan in a test signal to the input of the test circuit and the input of the reference circuit; and a second scanable flip flop coupled to an output of the latch, the second scanable flip flop configured to scan out an indicator of the presence of a soft-fail in the test circuit.

9. An integrated circuit testing system comprising:

an integrated circuit to be tested for a presence of a soft-fail;

a test controller configured to control testing of the integrated circuit to detect a presence of a soft-fail; and a test module coupled between the integrated circuit and the test controller, the test module configured to input test signals to the integrated circuit and to output signals corresponding to the test signals from the integrated circuit, the test module comprising, a combinatorial logic block having a first signal input coupled to the integrated circuit and a second signal input, the combinatorial logic block configured to produce a pulse when only when a first signal provided by the first signal input and a second signal provided by the second signal input differ in value, wherein the pulse has a pulse width that is based on a timing difference between a first signal transition on the first signal and a second signal transition on the second signal, wherein the combinatorial logic block produces the pulse if the timing difference is greater than a first threshold, wherein the combinatorial logic block operates with balanced inputs; and a latch coupled to an output of the combinatorial logic block, the latch configured to capture the logical high pulse if the logical high pulse has a pulse width greater than a second threshold.

10. The integrated circuit testing system of claim 9, wherein the test module further comprises:

a test signal generate unit coupled to the test controller and to the integrated circuit, the test signal generate unit configured to generate test signals to be input to the integrated circuit; and a data capture unit coupled to the integrated circuit, the data capture unit configured to store signal corresponding to the test signals from the integrated circuit.

11. The integrated circuit testing system of claim 9, wherein the test controller is further configured to determine the presence of a soft-fail in the integrated circuit by examining a value stored in the latch.

12. The integrated circuit testing system of claim 11, wherein the integrated circuit is faulty if the value is equal to a logical high value.

13. The integrated circuit testing system of claim 9, wherein the integrated circuit has an expected propagation delay, and wherein the integrated circuit testing system further comprises, a reference circuit coupled to the second signal input of the combinatorial logic block, the reference circuit configured to have a second propagation delay substantially equal to the expected propagation delay, wherein an actual propagation delay of the integrated circuit is greater than the expected propagation delay if the integrated circuit has a soft-fail.

14. The integrated circuit testing system of claim 13, wherein the reference circuit and the integrated circuit are on a single substrate.

15. The integrated circuit testing system of claim 13, wherein the reference circuit and the integrated circuit are on different substrates.

16. The integrated circuit testing system of claim 13, wherein the test module further comprises:

a first scanable flip flop coupled to an input of the integrated circuit and an input of the reference circuit, the first scanable flip flop configured to scan in a test signal to the input of the integrated circuit and the input of the reference circuit; and a second scanable flip flop coupled to an output of the latch, the second scanable flip flop configured to scan out an indicator of the presence of a soft-fail in the test circuit.

17. A method for testing integrated circuits, the method comprising:

providing a test signal to a test circuit and a reference circuit;

generating a pulse having a pulse width based on a timing difference between a first output of the test circuit responsive to the test signal and a second output of the reference circuit responsive to the test signal; and determining a presence of a fault in the test circuit based on a duration of the pulse width.

18. The method of claim 17, wherein generating a pulse comprises, generating a pulse in response to determining that the first output and the second output have different logical values.

19. The method of claim 17, wherein determining a presence of a fault comprises:

determining that the test circuit has at least one fault in response to determining that the pulse width is greater than a threshold; and determining that the test circuit does not have a fault in response to determining that the pulse width is less than a threshold.

20. The method of claim 17, wherein the fault is a soft-fail.

* * * * *